United States Patent
Tanida et al.

(10) Patent No.: US 6,949,805 B2
(45) Date of Patent: Sep. 27, 2005

(54) SEMICONDUCTOR DEVICE HAVING LOW INTERFACE STATE DENSITY AND METHOD FOR FABRICATING THE SAME

(75) Inventors: Yoshiaki Tanida, Kawasaki (JP); Yoshihiro Sugiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/614,227

(22) Filed: Jul. 8, 2003

(65) Prior Publication Data

US 2004/0004248 A1 Jan. 8, 2004

(30) Foreign Application Priority Data

Jul. 8, 2002 (JP) ........................................ 2002-198993

(51) Int. Cl.[7] ..................... H01L 29/76; H01L 29/94; H01L 31/062; H01L 31/113; H01L 31/119
(52) U.S. Cl. ..................... 257/411; 257/410; 257/406
(58) Field of Search ..................... 257/310, 406, 257/410, 411; 438/240, 287, 591, 785

(56) References Cited

U.S. PATENT DOCUMENTS

| | | | |
|---|---|---|---|
| 6,013,553 A | * | 1/2000 | Wallace et al. ............. 438/287 |
| 6,200,891 B1 | * | 3/2001 | Jagannathan et al. ....... 438/622 |
| 6,844,604 B2 | * | 1/2005 | Lee et al. .................... 257/410 |
| 2002/0153579 A1 | * | 10/2002 | Yamamoto ................... 257/412 |
| 2004/0084736 A1 | * | 5/2004 | Harada ........................ 257/410 |

* cited by examiner

*Primary Examiner*—Mary Wilczewski
*Assistant Examiner*—Monica Lewis
(74) *Attorney, Agent, or Firm*—Westerman, Hattori, Daniels & Adrian, LLP

(57) ABSTRACT

The semiconductor device comprises an intermediate layer formed on a semiconductor substrate 6, the intermediate layer 12 being formed of an oxide containing a first element which is either of a III group element and a V group element, an insulation film formed on the intermediate layer, the insulation film being formed of an oxide of a second element which is the other of the III group element and the V group element, and an electrode 16 formed on the insulation film. Because the intermediate layer of the oxide containing the first element is formed, even when the gate insulation film is formed of $Al_2O_3$ or others, the interface state density can be depressed to be low. Thus, the semiconductor device can have low interface state density and small flat band voltage shift even when $Al_2O_3$, etc. is used as a material of the insulation film.

13 Claims, 15 Drawing Sheets

SEMICONDUCTOR DEVICE HAVING LOW INTERFACE STATE DENSITY AND METHOD FOR FABRICATING THE SAME

CROSS-REFERENCE TO RELATED APPLICATION

This application is based upon and claims priority of Japanese Patent Application No.2002-198993, filed on Jul. 8, 2002, the contents being incorporated herein by reference.

BACKGROUND OF THE INVENTION

The present invention relates to a semiconductor device and a method for fabricating the semiconductor device, more specifically a semiconductor device having a MOS structure and a method for fabricating the semiconductor device.

As an insulation film for MOS (Metal Oxide Semiconductor) structure, $SiO_2$ film has been conventionally predominantly used. $SiO_2$ film has been increasingly thinned as semiconductor devices are increasingly micornized. However, it is said that the limit of thinning $SiO_2$ film is about 3 nm. Then, studies of forming the gate insulation film of materials of higher dielectric constants than that of $SiO_2$ film are being made.

$Al_2O_3$ is noted as a material which well matches with the conventional semiconductor processes and additionally has a higher dielectric constant than $SiO_2$ film.

A proposed semiconductor device which uses $Al_2O_3$ as a material of the gate insulation film will be explained with reference to FIG. 13. FIG. 13 is a sectional view of the proposed semiconductor device.

As shown in FIG. 13, an element isolation region 110 for defining en element region 108 is formed on a silicon substrate 106. A gate insulation film 114 of $Al_2O_3$ is formed on the silicon substrate 106 in the element region 108. A gate electrode 116 of polysilicon is formed on the gate insulation film 114. A cap film 118 is formed on the gate electrode 116. Dopant diffused regions 120a forming shallow regions of an extension source drain are formed on silicon substrate 106 on both sides of the gate electrode 116. A sidewall insulation film 122 is formed on the side walls of the gate electrode 116. Dopant diffused regions 120b forming deep regions of the extension source drain are formed on both sides of the gate electrode 116 with the sidewall insulation film formed on the side walls. The dopant diffused regions 120a and the dopant diffused regions 120b form a source/drain diffused layer 120 of the extension source drain structure. Thus, the proposed semiconductor device is constituted.

However, when $Al_2O_3$ is used as a material of the gate insulation film 114, the flat band voltage largely shifts. FIG. 14 is a graph of the C-V characteristics. Gate biases are taken on the horizontal axis. Capacitances are taken on the vertical axis. As evident in FIG. 14, when $Al_2O_3$ is used as a material of the gate insulation film, the flat band voltage shifts by about 0.4 V in comparison with that in the case that $SiO_2$ is used as a material of the gate insulation film.

Furthermore, the flat band voltage shift tends to be larger as the film thickness of the $Al_2O_3$ film is thinner. FIG. 15 is a graph of relationships between the film thickness of the $Al_2O_3$ film and the flat band voltage shift. Oxide film converted film thicknesses are taken on the horizontal axis, and shifts of the flat band voltage are taken on the vertical axis. The measuring conditions are as follows. That is, a p type silicon substrate was used as the substrate, nitrogen added $Al_2O_3$ film was used as the insulation film, and polysilicon film was used as the electrode. The measuring temperature was −25° C. As evident in FIG. 15, the flat band voltage shift tends to be higher as the $Al_2O_3$ film is thinner.

When a flat band voltage shift is large, a required threshold voltage cannot be obtained. Accordingly, even in a case that $Al_2O_3$ film, etc. are used as a material of the gate insulation film, techniques which can suppress the flat band voltage shift have been expected.

SUMMARY OF THE INVENTION

An object of the present invention is to provide a semiconductor device which can suppress the flat band voltage shift even when $Al_2O_3$ film, etc. are used as a material of the insulation film, and a method for fabricating the semiconductor device.

According to one aspect of the present invention, there is provided a semiconductor device comprising: an intermediate layer formed on a semiconductor substrate, the intermediate layer being formed of an oxide containing a first element which is either of a III group element and a V group element; an insulation film formed on the intermediate layer, the insulation film being formed of an oxide of a second element which is the other of the III group element and the V group element; and an electrode formed on the insulation film.

According to another aspect of the present invention, there is provided a semiconductor device comprising: an insulation film formed on a semiconductor substrate, the insulation film being formed of an oxide of either of a III group element and a V group element; an intermediate layer formed on the insulation film, the intermediate layer being formed of an oxide containing the other of the III group element and the V group element; and an electrode formed on the intermediate layer.

According to further another aspect of the present invention, there is provided a method for fabricating a semiconductor device comprising the steps of: forming an intermediate layer of an oxide containing a first element which is either of a III group element and a V group element on a semiconductor substrate; forming an insulation film of an oxide of a second element which is the other of the III group element and the V group element on the intermediate layer; and forming an electrode on the insulation film.

As described above, according to the present embodiment, the intermediate layer of an oxide of either element of a III group element and a V group element is formed between a semiconductor substrate and the gate insulation film of an oxide of the other element of the III group element and the V group element, whereby even when $Al_2O_3$ or others are used as a material of the gate insulation film, the fixed charge can be decreased. Thus, according to the present invention can provide a semiconductor device which can prevent large flat band voltage shift and a method for fabricating the semiconductor device.

DETAILED DESCRIPTION OF THE INVENTION

[A First Embodiment]

Figure 1:
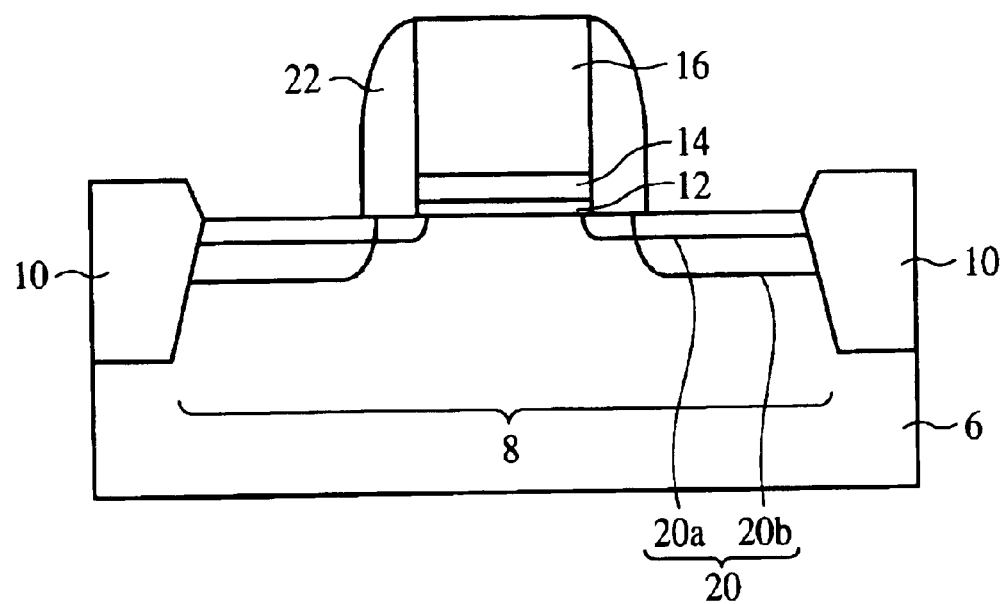
FIG. 1 is a sectional view of the semiconductor device according to a first embodiment of the present invention.

The semiconductor device according to a first embodiment of the present invention and the method for fabricating the semiconductor device will be explained with reference to FIGS. 1 to 4B. FIG. 1 is a sectional view of the semiconductor device according to the present embodiment.

(The Semiconductor Device)

First, the semiconductor device according to the first embodiment will be explained with reference to FIG. 1.

As shown in FIG. 1, an element isolation region 10 defining an element region 8 is formed on a silicon substrate 6.

An intermediate layer 12 of, e.g., a 1 nm-thickness is formed on the silicon substrate 10 in the element region 8. The intermediate layer 12 is formed of an oxide containing at least Ta (tantalum). Specifically, the intermediate layer 12 is formed of a film containing Al (aluminum), Ta, Si (silicon) and O (oxygen). The intermediate layer 12 has, e.g., a 1 nm-thickness.

A gate insulation film 14 of $Al_2O_3$ of, e.g., a 4 nm-thickness is formed on the intermediate layer 12.

A gate electrode 16 of a polysilicon film of, e.g., a 100~200 nm-thickness is formed on the gate insulation film 14.

Dopant diffused regions 20a which form shallow regions of extension source drains are formed on the silicon substrate 10 on both sides of the gate electrode 16.

A sidewall insulation film 22 of, e.g., $SiO_2$ is formed on the side walls of the gate electrode 16.

Dopant diffused regions 20b forming deep regions of the extension source drains are formed on the silicon substrate 10 on both sides of the gate electrode 16 with the sidewall insulation film 22 formed on the side walls.

The dopant diffused regions 20a and the dopant diffused regions 20b form a source/drain diffused layer 20 of the extension source drain structure.

The semiconductor device according to the present embodiment has such constitution.

The semiconductor device according to the present embodiment is characterized mainly in that the intermediate layer 14 formed of an oxide containing at least Ta is formed between the silicon substrate 6 and the gate insulation film 14 of $Al_2O_3$.

In the proposed semiconductor device, which uses $Al_2O_3$ as the gate insulation film, the substrate is formed of Si, which is a IV group element, and the gate insulation film contains Al, which is a III group element, whereby Al non-combined bonds are present in the interface between the silicon substrate and the gate insulation film, and the interface level density is high. When the interface state density is high, charges corresponding to the surface potentials are stored in the interface. However, what is most important is charges generated in the film by the non-combined bonds, etc., and the charges cause the large flat band voltage shift.

In contrast to this, in the present embodiment, the intermediate layer of an oxide containing at least Ta is formed between the silicon substrate 6 and the gate insulation film 16 of $Al_2O_3$. In the present embodiment, in which Al contained in the gate insulation film 14 is an III group element, but Ta contained in the intermediate layer 12 is a V group element, the Al non-combined bonds can be prevented. Thus, according to the present embodiment, even when $Al_2O_3$ is used as a material of the gate insulation film 14, the fixed charge amount can be depressed to be small, and large flat band voltage shifts can be prevented.

(The Method for Fabricating the Semiconductor Device)

Next, the method for fabricating the semiconductor device according to the present embodiment will be explained with reference to FIGS. 2A to 4B. FIGS. 2A to 4B are sectional views of the semiconductor device in the steps of the method for fabricating the semiconductor, which show the method.

Figure 2A:
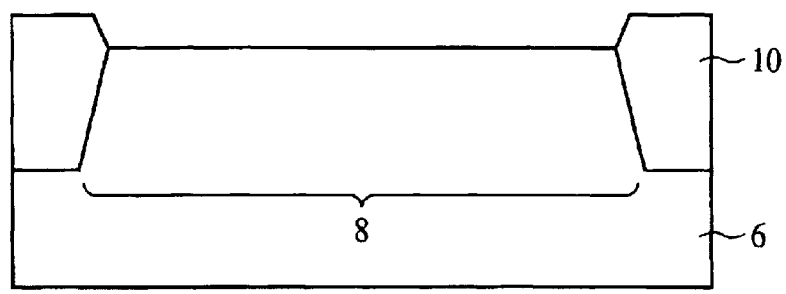
FIGS. 2A to 2C are sectional views of the semiconductor device according to the first embodiment of the present invention in the steps of the method for fabricating the semiconductor device, which show the method (Part 1).

First, as shown in FIG. 2A, a silicon substrate 6 of, e.g., (001) plane direction is prepared.

Next, the element isolation region 10 for defining the element region 8 is formed on the silicon substrate 6 by, e.g., LOCOS or STI.

Next, the sacrificed oxide film is removed by using, e.g., a 0.5% HF aqueous solution.

Figure 2B:
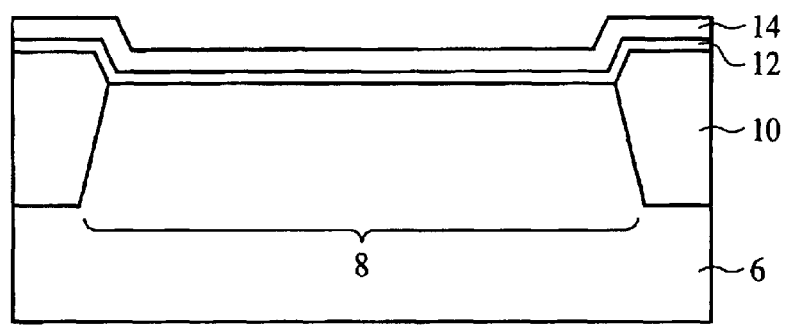

Then, as shown in FIG. 2B, the intermediate layer 12 containing at least Ta is formed on the entire surface by e.g., MOCVD. Specifically, the intermediate layer 12 is formed of a film containing Al, Ta, Si and O. The thickness of the intermediate layer 12 is, e.g., 1 nm. Informing the intermediate layer 12, a raw material gas for the Ta, a raw material gas for the Al and $O_2$ gas are fed under reduced pressure. As a material gas for the Ta, Pent-Etochisi-Tantalate (PET), for example, is used as a raw material for the Ta. As a raw material gas for the Al, Tri-Ethyle-Aluminum (TEA), for example, is used.

Then, the gate insulation film 14 is formed of $Al_2O_3$ on the entire surface by, e.g., MOCVD. The thickness of the gate insulation film 14 is, e.g., 4 nm. As a raw material of the Al, as described above, Tri-Ethyle-Aluminum (TEA), for example, is used. The intermediate layer 12 and the gate insulation film 14 can be formed in continuous steps.

Then, thermal processing is performed for 10 seconds in an $N_2$ atmosphere and at 800° C.

Figure 2C:
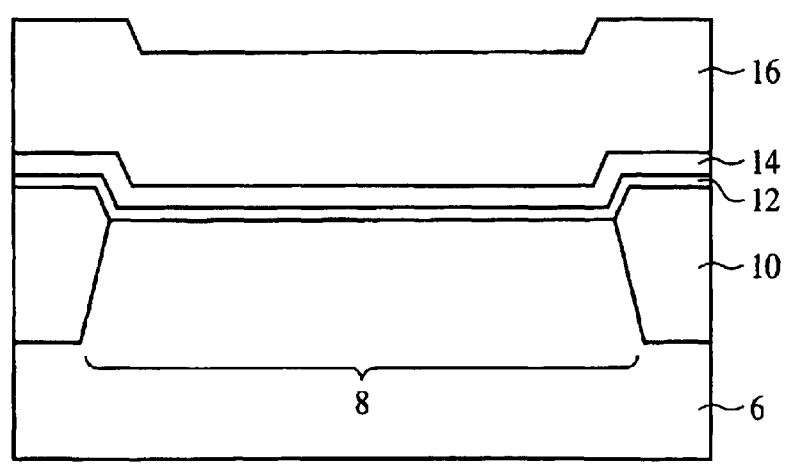

Then, as shown in FIG. 2C, a 100~200 nm-thickness polysilicon film 16 is formed on the entire surface by, e.g., CVD. The polysilicon film 16 is patterned to be the gate electrode in a later step. A film forming condition for forming the polysilicon film 16 is, e.g., 650° C.

Figure 3A:
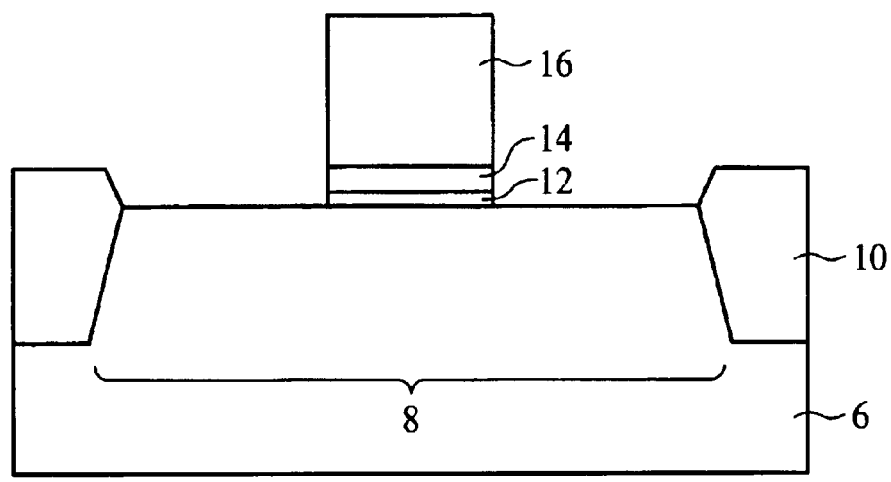
FIGS. 3A and 3B are sectional views of the semiconductor device according to the first embodiment of the present invention in the steps of the method for fabricating the semiconductor device, which show the method (Part 2).

Next, as shown in FIG. 3A, the polysilicon film 16 is patterned by photolithography. The polysilicon film 16 is patterned by, e.g., dry etching. Thus, the gate electrode 16 of polysiliocn is formed.

Figure 3B:
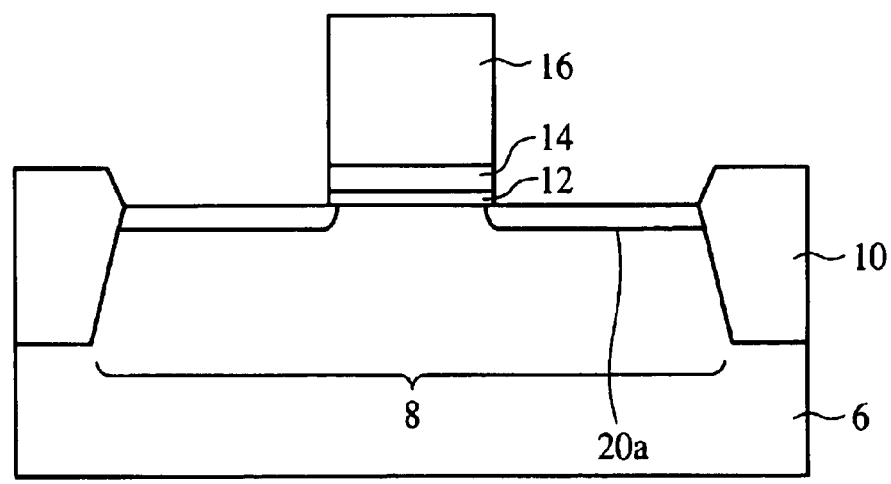
Figure 4A:
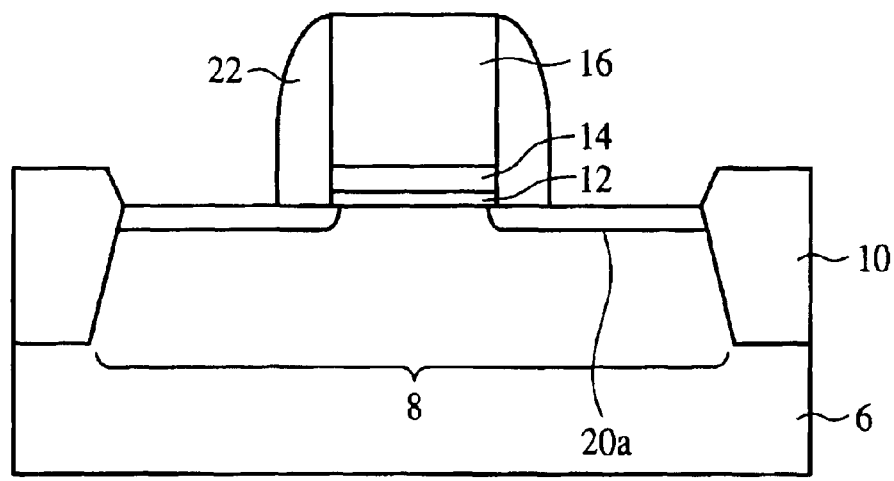
FIGS. 4A and 4B are sectional views of the semiconductor device according to the first embodiment of the present invention in the steps of the method for fabricating the semiconductor device, which show the method (Part 3).
Figure 4B:
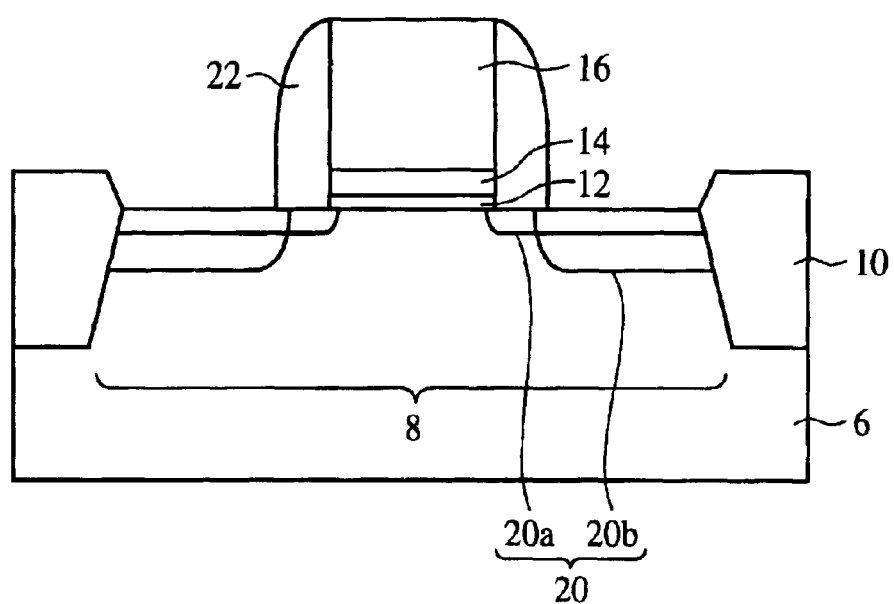

Then, as shown in FIG. 3B, with the gate electrode 16 as a mask, a dopant is implanted in the silicon substrate 6 on both sides of the gate electrode 16 by ion implantation. Thus, the dopant diffused regions 20a forming the shallow regions of the extension source drain are formed.

Next, a silicon nitride oxide film of, e.g., a 130 nm-thickness is formed on the entire surface. Then, the silicon nitride oxide film is anisotropically etched. Thus, the sidewall insulation film 22 of the silicon nitride oxide film is formed on the side walls of the gate electrode (see FIG. 4A).

The, with the gate electrode 16 with the sidewall insulation film 22 formed on the sidewalls, a dopant is implanted in the silicon substrate 6 by ion implantation. Thus, the dopant diffused region 20b forming the deep regions of the extension source drain are formed. Thus, the source/drain diffused layer 20 of the extension source/drain structure having the dopant diffused regions 20a and the dopant diffused regions 20b is formed.

As described above, the semiconductor device according to the present embodiment is fabricated.

(Evaluation Result)

Results of the evaluation of the semiconductor device according to the present embodiment will be explained.

First, C-V characteristics were measured to thereby obtain the shift $\Delta V_{fb}$ of the flat band voltage. The shift $\Delta V_{fb}$ of the flat band voltage was satisfactorily depressed to be as small as 0.2 V.

The interface state density was given based on the conductance. The interface state density was satisfactorily depressed to be as low as $5 \times 10^{10}$ $cm^{-2}/eV$.

Based on the results, the semiconductor device according to the present embodiment can have low interface state density and small flat band voltage shift even when $Al_2O_3$ is used as a material of the gate insulation film.

[A Second Embodiment]

Figure 5:
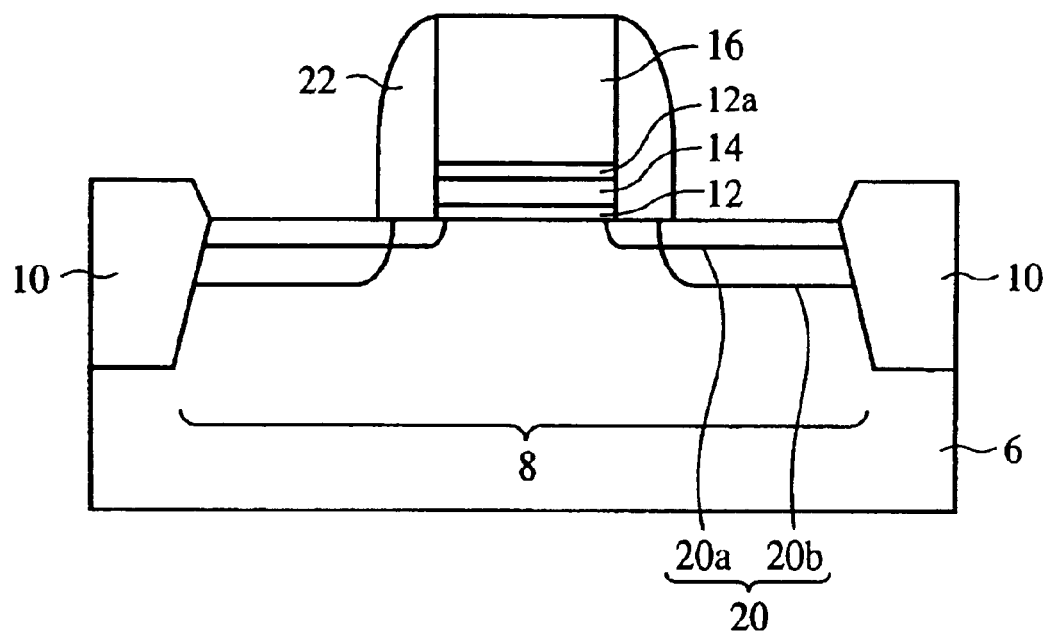
FIG. 5 is a sectional view of the semiconductor device according to a second embodiment of the present invention.

The semiconductor device according to a second embodiment of the present invention and the method for fabricating the semiconductor device will be explained with reference to FIGS. 5 to 8B. FIG. 5 is a sectional view of the semiconductor device according to the present embodiment. The same members of the present embodiment as those of the semiconductor device according to the first embodiment and the method for fabricating the semiconductor device shown in FIGS. 1 to 4B are represented by the same reference numbers not to repeat or to simplify their explanation.

(The Semiconductor Device)

First, the semiconductor device according to the present embodiment will be explained with reference to FIG. 5.

The semiconductor device according to the present embodiment is characterized mainly in that not only an intermediate layer 12 is formed between a silicon substrate 6 and a gate insulation film 14 but also an intermediate layer 12a is formed between the gate insulation film 14 and a gate electrode 16.

As shown in FIG. 5, in the present embodiment, the intermediate layer 12a is formed between the gate insulation film 14 and the gate electrode 16. The intermediate layer 12a can be formed of the same material as, e.g., the intermediate layer 12.

The gate electrode of polysilicon is formed of Si, which is a IV group element. The gate insulation film of $Al_2O_3$ contains Al, which is III group element. When the gate insulation film contacts the gate electrode, Al non-combined bonds are present in the interface between the gate insulation film and the gate electrode, which is a factor for large fixed charge amount.

According to the present embodiment, wherein not only the intermediate layer 12 is formed between the silicon substrate 6 and the gate insulation film 14 but also the intermediate layer 12a is formed between the gate insulation film 14 and the gate electrode 16, not only the fixed charge in the interface between the silicon substrate 6 and the gate insulation film 14 but also the fixed charge in the interface between the gate insulation film 14 and the gate electrode 16 can be decreased. Thus, the semiconductor device according to the present embodiment can suppress the flat band voltage shift.

(The Method for Fabricating the Semiconductor Device)

Next, the method for fabricating the semiconductor device according to the present embodiment will be explained with reference to FIGS. 6A to 8B.

Figure 6A:
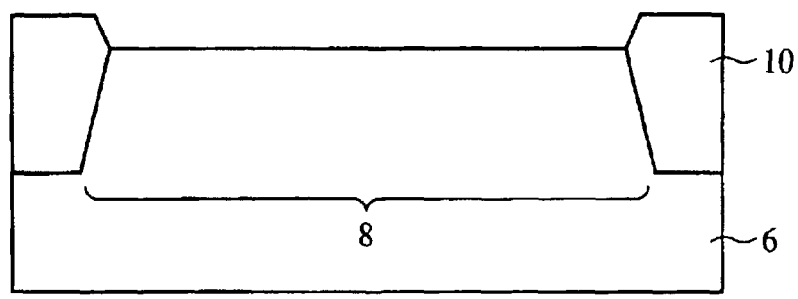
FIGS. 6A and 6C are sectional views of the semiconductor device according to the second embodiment in the steps of the method for fabricating the semiconductor device, which show the method (Part 1).
Figure 6B:
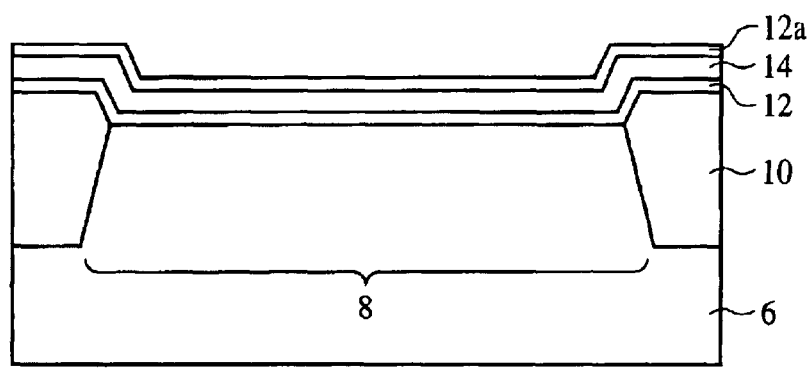
Figure 6C:
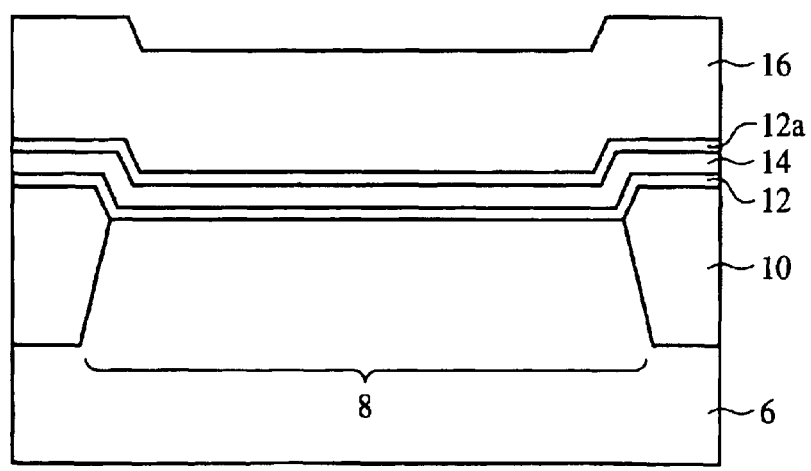
Figure 7A:
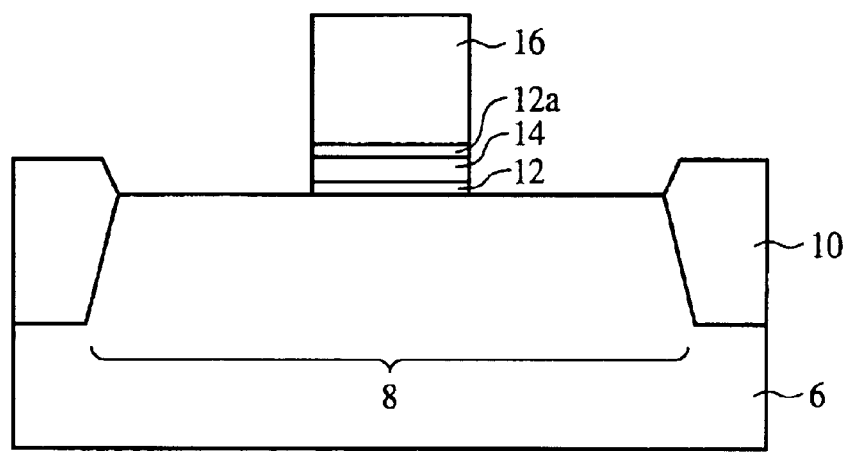
FIGS. 7A and 7B are sectional views of the semiconductor device according to the second embodiment in the steps of the method for fabricating the semiconductor device, which show the method (Part 2).
Figure 7B:
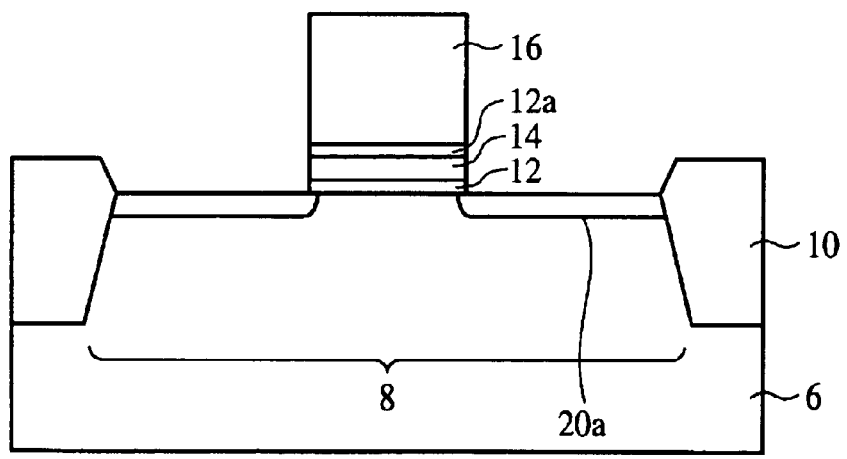
Figure 8A:
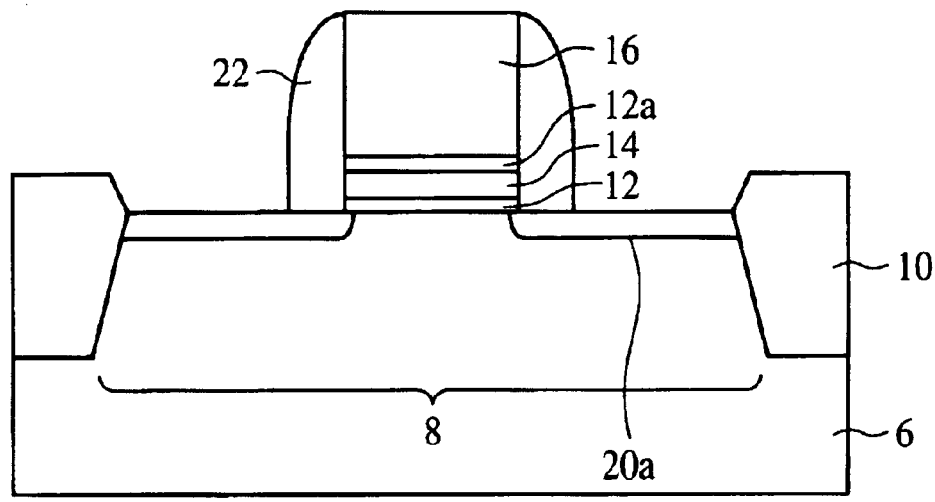
FIGS. 8A and 8B are sectional views of the semiconductor device according to the second embodiment in the steps of the method for fabricating the semiconductor device, which show the method (Part 3).
Figure 8B:
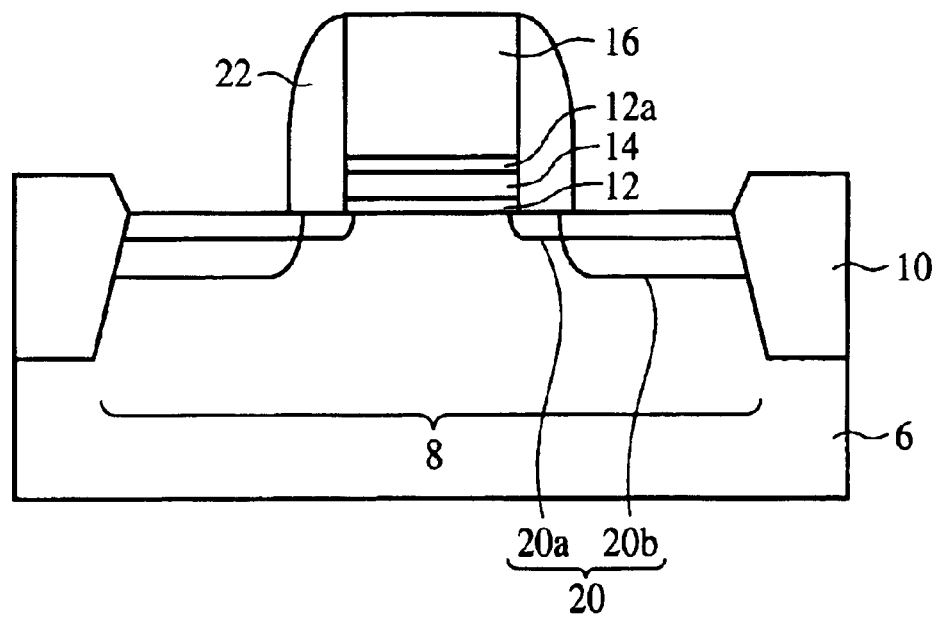

First, the steps up to the steps of forming the gate insulation film 14 including the gate insulation film 14 forming step are the same as those of the above-described semiconductor device fabrication method shown in FIGS. 2A and 2B, and their explanation will not be repeated (see FIGS. 6A and 6B).

Next, as shown in FIG. 6B, the intermediate layer 12a is formed on the entire surface by MOCVD. The method for forming the intermediate layer 12a is the same as the above-described method for forming the intermediate layer 12.

The steps of the method for forming the semiconductor device shown in FIGS. 6C to 8B are the same as those of the semiconductor device fabrication method describe above with reference to FIGS. 2C to 4B, and their explanation will not be repeated.

Thus, the semiconductor device according to the present embodiment is fabricated.

[A Third Embodiment]

Figure 9:
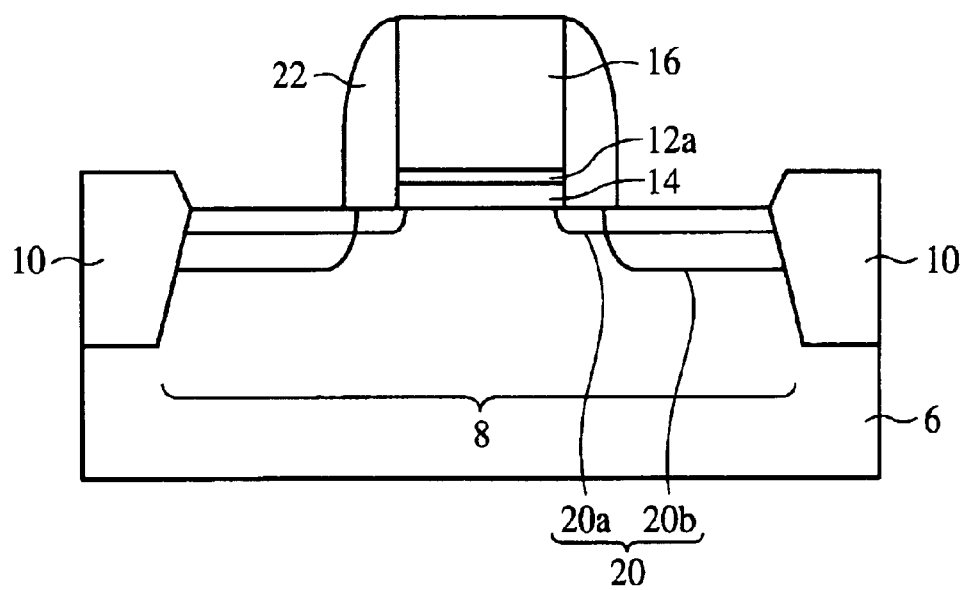
FIG. 9 is a sectional view of the semiconductor device according to a third embodiment of the present invention.

The semiconductor device according to a third embodiment of the present invention and the method for fabricating the semiconductor device will be explained with reference to FIGS. 9 to 12. FIG. 9 is a sectional view of the semiconductor device according to the present embodiment. The same members of the present embodiment as those of the semiconductor device according to the first or the second embodiment and the method for fabricating the semiconductor device shown in FIGS. 1 to 8B are represented by the same reference numbers not to repeat or to simplify their explanation.

(The Semiconductor Device)

First, the semiconductor device according to the present embodiment will be explained with reference to FIG. 9.

The semiconductor device according to the present embodiment is characterized mainly in that the intermediate layer 12 is not formed between a silicon substrate 6 and a gate insulation film 14 but the intermediate layer 12a is formed only between the gate insulation film 14 and a gate electrode 16.

As shown in FIG. 9, in the present embodiment, the gate insulation film 14 is formed directly on the silicon substrate 6.

The intermediate layer 12a is formed between the gate insulation film 14 and the gate electrode 16.

As described above, it is possible that no intermediate layer 12 is formed in the interface between the silicon substrate 6 and the gate insulation film 14, but the intermediate layer 12a is formed only between the gate insulation film 14 and the gate electrode 16.

In the semiconductor device according to the present embodiment, because of no intermediate layer 12 between the silicon substrate 6 and the gate insulation film 14, the fixed charge in the interface between the silicon substrate 6 and the gate insulation film 14 cannot be decreased, but the fixed charge in the interface between the gate insulation film 14 and the gate electrode 16 can be decreased because of the intermediate layer 12a is formed between the gate insulation film 14 and the gate electrode 16. Accordingly, the present embodiment can suppress the flat band voltage shift.

(The Method for Fabricating the Semiconductor Device)

Next, the method for fabricating the semiconductor device according to the present embodiment will be explained with reference to FIGS. 10A to 12B.

First, the steps up to the step of removing a sacrifice oxide film including the sacrifice oxide film removing step are the same as those of the method for fabricating the semiconductor device explained with reference to FIG. 2A, and their explanation will not be repeated.

Figure 10A:
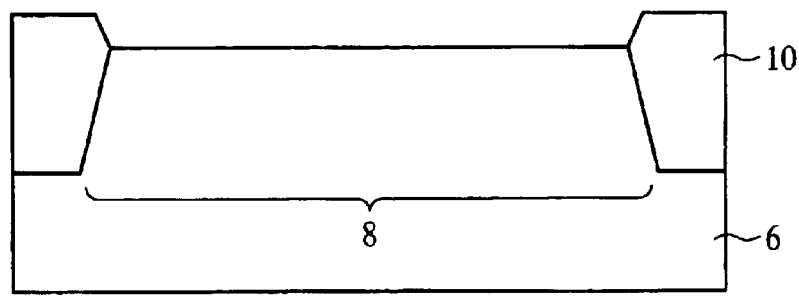
FIGS. 10A and 10C are sectional views of the semiconductor device according to the third embodiment of the present invention in the steps of the method for fabricating the semiconductor device, which show the method (Part 1).
Figure 10B:
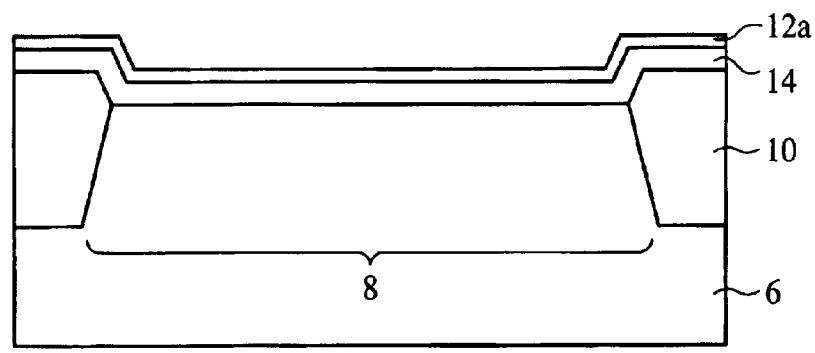
Figure 10C:
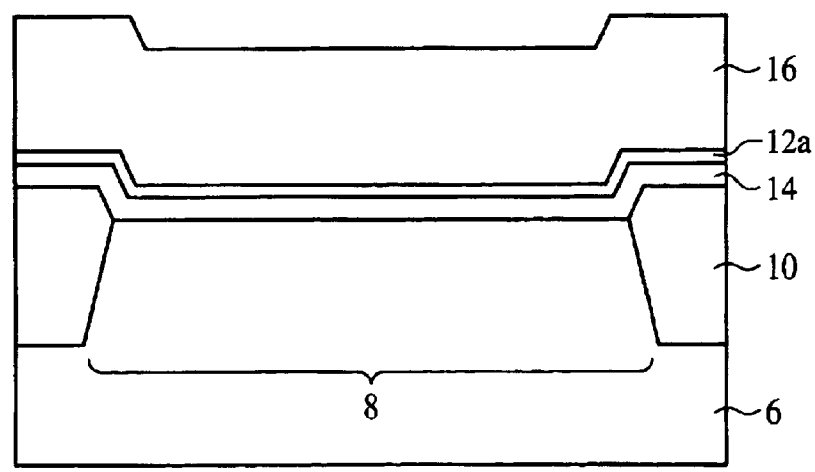
Figure 11A:
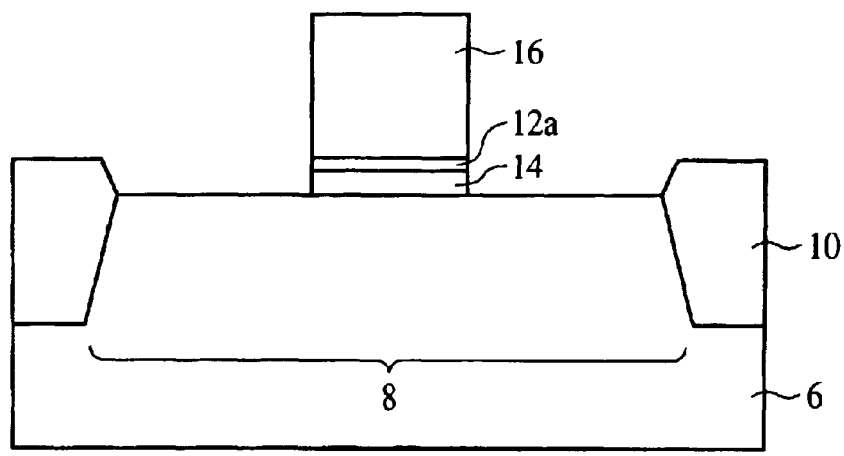
FIGS. 11A and 11B are sectional views of the semiconductor device according to the third embodiment in the steps of the method for fabricating the semiconductor device, which show the method (Part 2).
Figure 11B:
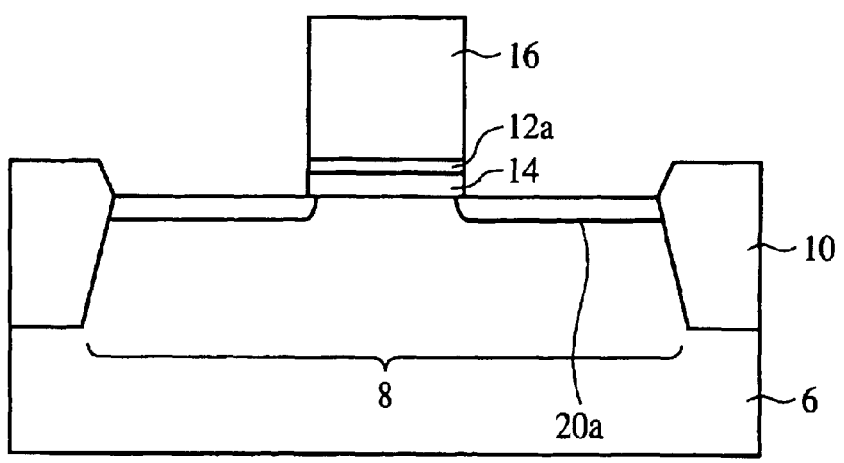
Figure 12A:
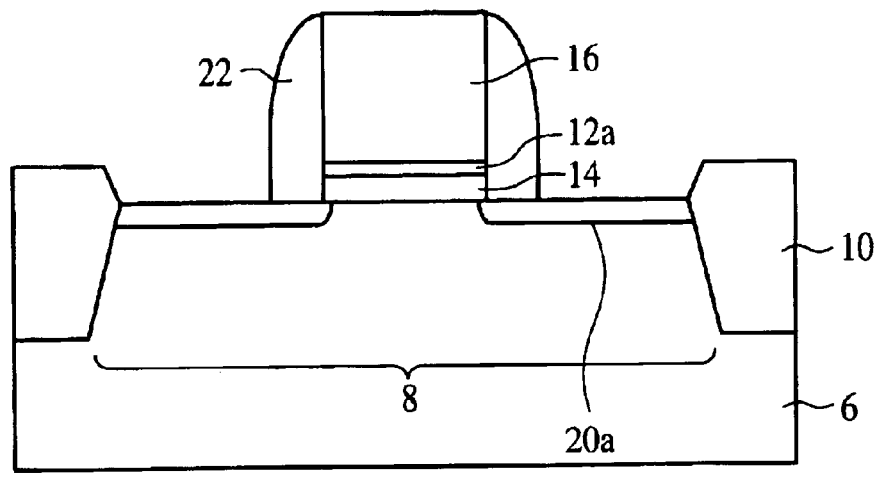
FIGS. 12A and 12B are sectional views of the semiconductor device according to the third embodiment in the steps of the method for fabricating the semiconductor device, which show the method (Part 3).
Figure 12B:
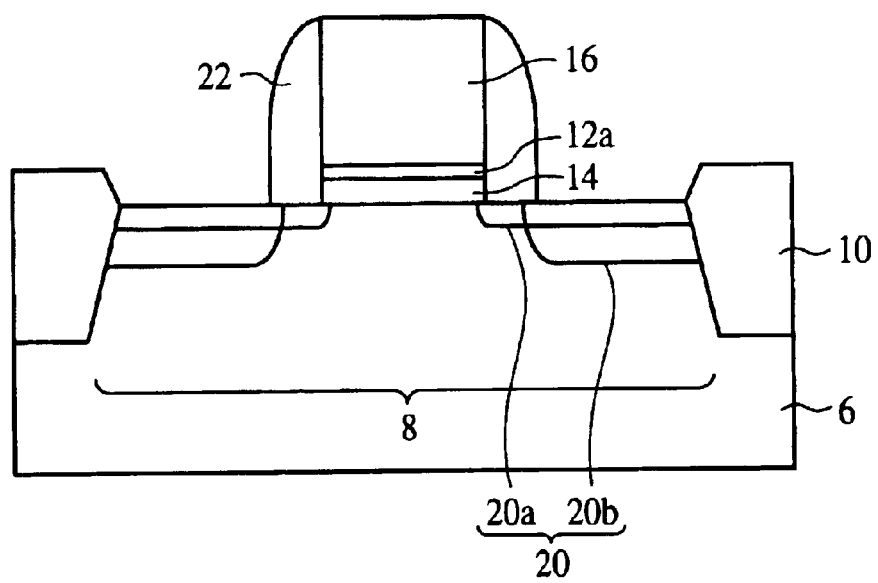
Figure 13:
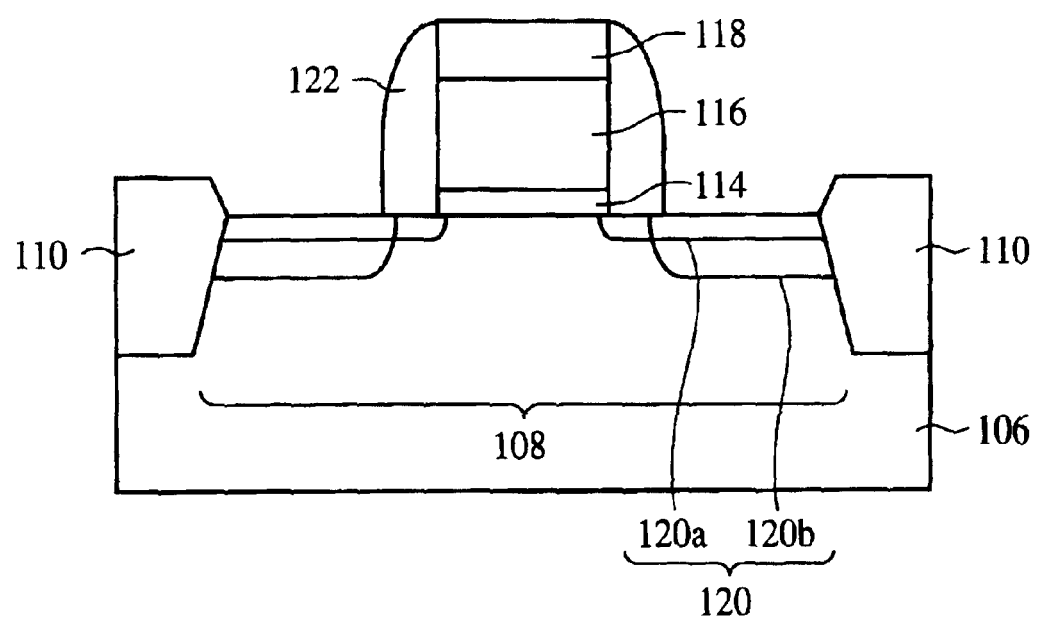
FIG. 13 is a sectional view of the proposed semiconductor device.
Figure 14:
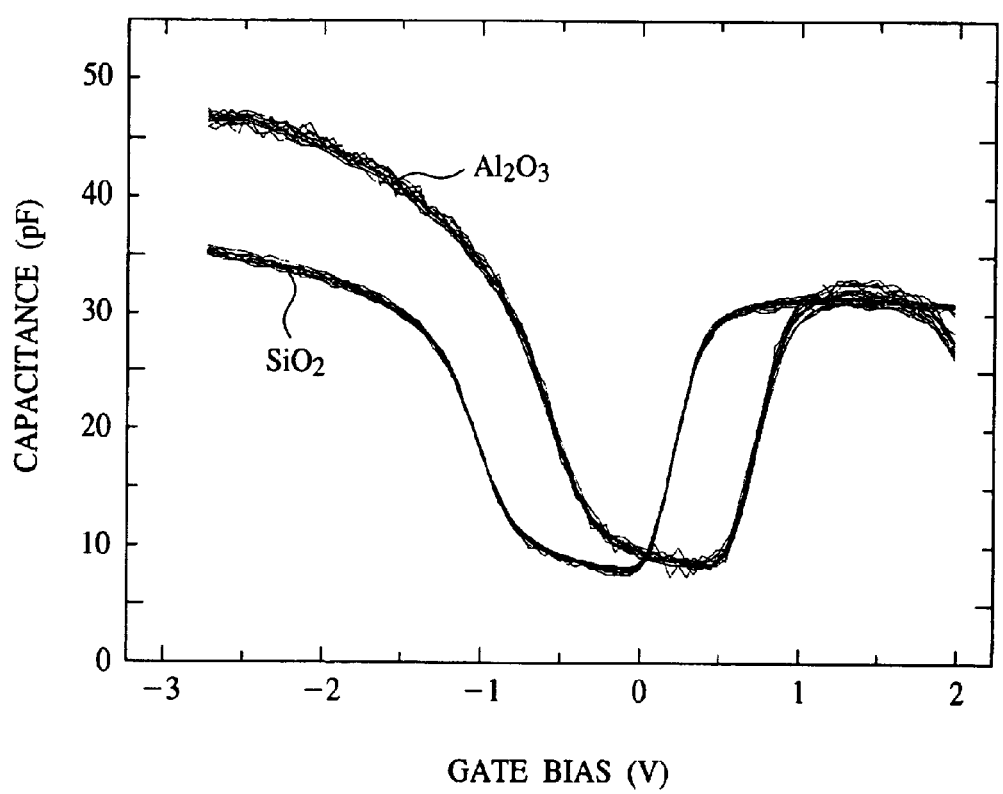
FIG. 14 is a graph of C-V characteristics.
Figure 15:
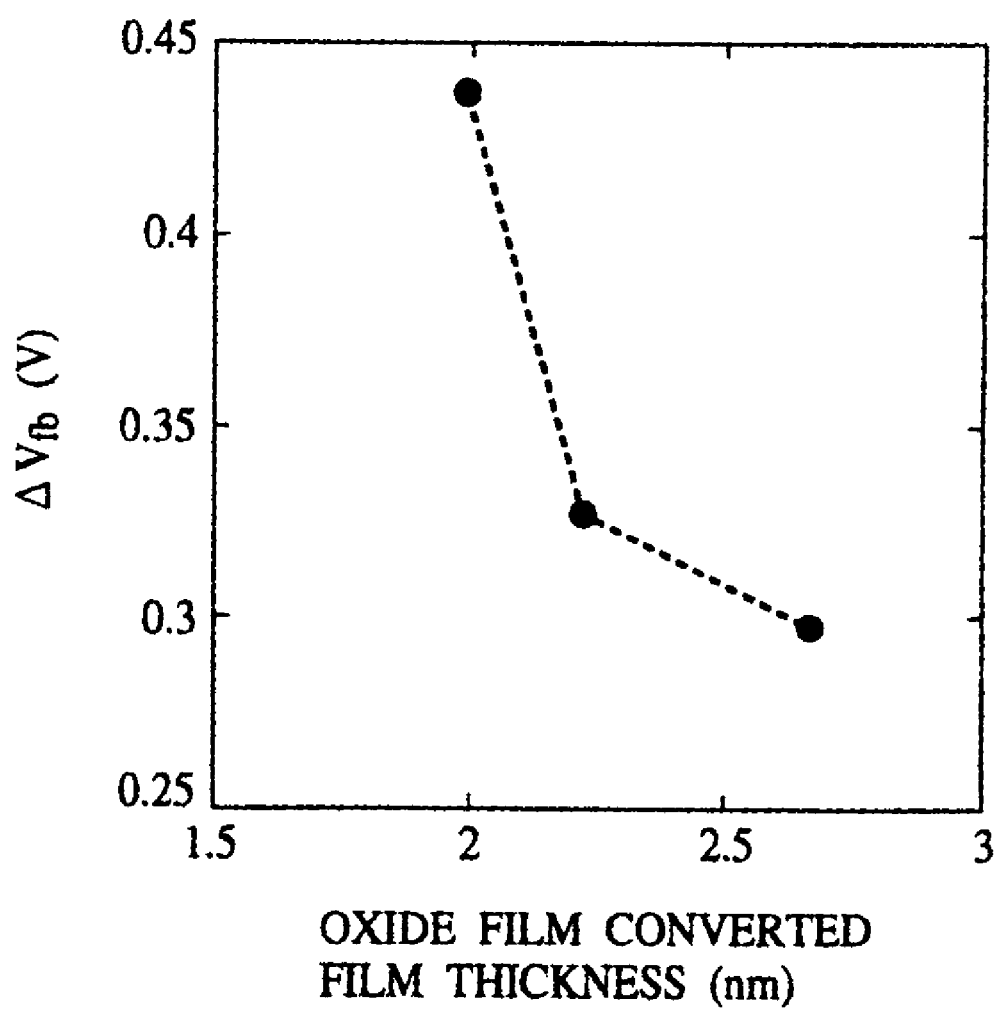
FIG. 15 is a graph of relationships between film thicknesses of $Al_2O_3$ film and flat band voltage shifts.

Then, as shown in FIG. 10B, the gate insulation film 14 is formed on the entire surface without forming the intermediate layer 12. The gate insulation film 14 is formed in the same way as, e.g., described above.

Then, the intermediate layer 12a is formed on the entire surface. The intermediate layer 12a is formed in the same way as, e.g., described above.

The following steps of the semiconductor device fabrication method shown in FIGS. 10C to 12B are the same as those of the semiconductor device fabrication method described above with reference to FIGS. 2C to 4B, and their explanation will be not repeated.

The semiconductor device according to the present embodiment is thus fabricated.

[Modifications]

The present invention is not limited to the above-described embodiments and can cover other various modifications.

For example, in the above-described embodiments, the intermediate layer is formed of a film containing Al, Ta, Si and O. However, the intermediate layer is not essentially formed of a film containing Al, Ta, Si and O, and can be formed of a wide variety of oxide films containing V group elements. For example, the intermediate layer can be formed of a film containing Al, V (vanadium), Si and O, a film containing Al, Nb (niobium), Si and O, a film containing Al, U (uranium), Si and O or others. Vanadium (V), Nb and U are all V group elements and can prevent the generation of non-combined bonds of Al, which is a III group element.

In the above-described embodiments, the intermediate layer contains Al but may not essentially contain Al.

In the above-described embodiments, the intermediate layer contains no nitrogen but may contain nitrogen. The intermediate layer contains nitrogen, whereby a dopant, such as B (boron), implanted in the gate electrode is prevented from passing to the side of the silicon substrate. When the intermediate layer contains nitrogen, the volume density of the nitrogen in the intermediate layer can be, e.g., below 1%.

In the above-described embodiments, the film thickness of the gate insulation film of $Al_2O_3$ is 4 nm but is not essentially 4 nm. When the film thickness of the gate insulation film of $Al_2O_3$ is below 5 nm, the flat band shift voltage tends to be conspicuous. The present invention is effective especially when the film thickness of the gate insulation film is below 5 nm.

In the above-described embodiments, the gate insulation film is formed of $Al_2O_3$ film but is not essentially $Al_2O_3$ film. The principle of the prevent invention is applicable widely to cases where the gate insulation film is formed of an oxide film containing III group elements. The gate insulation film can be, e.g., $Sc_2O_3$ film, $Y_2O_3$ film, $La_2O_3$ film or others. Scadium (Sc), Y (yttrium), La are all III group elements, and the intermediate layer contains V group elements, whereby the generation of non-combined bonds can be prevented, and the fixed charge can be decreased.

In the above-described embodiments, the gate insulation film is formed of an oxide film containing III group elements but may be formed of an oxide film containing V group elements. When the gate insulation film is formed of anoxide film containing V group elements, the intermediate layer may be formed of an oxide film containing III group elements. To give examples, the intermediate layer of oxide containing III group elements can be film of an oxide containing, e.g., Th (thorium), or others.

In the above-described embodiments, the principle of the present invention is applied to the MOS transistor, but is applicable not only to MOS transistors but also to all the other semiconductor devices. For example, the principle of the present invention is applicable to the insulation films of MOS diodes. That is, a film formed of an oxide containing, e.g., III group elements is used as the insulation film of MOS diodes, and intermediate layers formed of an oxide containing, e.g., V group elements is formed between the insulation film and the semiconductor substrate and between the insulation film and the electrode. A film of an oxide containing, e.g., V group elements may be used as the insulation film of MOS diodes, and the intermediate layers of an oxide containing, e.g., III group elements may be formed between the insulation film and the semiconductor substrate and between the insulation film and the electrode. The principle of the present invention is applicable to the tunnel insulation film of floating gate-type transistors. That is, the tunnel insulation film is formed of a film of an oxide containing, e.g., III group elements, and intermediate layers formed of an oxide containing, e.g., V group elements are formed between the tunnel insulation film and the semiconductor substrate and between the tunnel insulation film and the electrode. The tunnel insulation film is formed of a film of an oxide containing, e.g., V group elements, and a film of an oxide containing, e.g., III group elements are formed between the tunnel insulation film and the semiconductor substrate and between the tunnel insulation film and the electrode.

In the above-described embodiments, silicon substrates are used, but silicon substrate are not essential. The principle of the present invention is applicable widely to cases where semiconductor substrates of IV group elements are used. For example, the principle of the present invention is applicable to cases where silicon germanium substrates, etc. are used.

What is claimed is:

1. A semiconductor device comprising:
   an intermediate layer formed on a semiconductor substrate, the semiconductor substrate being formed of a semiconductor containing a first element of a IV group element, the intermediate layer being formed of an oxide containing the first element and a second element which is either of a III group element or a V group element;
   an insulation film formed on the intermediate layer, the insulation film being formed of an oxide of a third element which is the other of the III group element and the V group element; and
   an electrode formed over the insulation film,
   wherein the intermediate layer is formed of an oxide containing the first element, the second element and the third element.

2. A semiconductor device according to claim 1, further comprising:
   another intermediate layer formed between the insulation film and the electrode, said another intermediate layer being formed of an oxide containing the second element.

3. A semiconductor device according to claim 2, wherein said another intermediate layer is formed of an oxide containing the second element and the third element.

4. A semiconductor device according to claim 1, wherein the insulation film has a thickness of 5 nm or below.

5. A semiconductor device according to claim 2, wherein the insulation film has a thickness of 5 nm or below.

6. A semiconductor device according to claim 1, wherein the third element is Al, Sc, Y or La.

7. A semiconductor device according to claim 2, wherein the third element is Al, Sc, Y or La.

8. A semiconductor device according to claim 6, wherein the insulation film is an $Al_2O_3$ film, $Sc_2O_3$ film, $Y_2O_3$ film or $La_2O_3$ film.

9. A semiconductor device according to claim 7, wherein the insulation film is an $Al_2O_3$ film, $Sc_2O_3$ film, $Y_2O_3$ film or $La_2O_3$ film.

10. A semiconductor device according to claim 1, wherein the second element is Ta, V, Nb, Th or U.

11. A semiconductor device according to claim 2, wherein the second element is Ta, V, Nb, Th or U.

12. A semiconductor device according to claim 1, wherein the intermediate layer further contains nitrogen.

13. A semiconductor device according to claim 2, wherein said another intermediate layer further contains nitrogen.

* * * * *